(12) United States Patent
Kasai

(10) Patent No.: US 11,075,174 B2
(45) Date of Patent: Jul. 27, 2021

(54) SEMICONDUCTOR DEVICE

(71) Applicant: Winbond Electronics Corp., Taichung (TW)

(72) Inventor: Takamichi Kasai, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/851,113

(22) Filed: Apr. 17, 2020

(65) Prior Publication Data

US 2020/0335457 A1    Oct. 22, 2020

(30) Foreign Application Priority Data

Apr. 17, 2019    (JP) ............................. JP2019-078396

(51) Int. Cl.
| | |
|---|---|
| *G11C 16/04* | (2006.01) |
| *H01L 23/60* | (2006.01) |
| *G11C 16/26* | (2006.01) |
| *G11C 16/32* | (2006.01) |

(52) U.S. Cl.
CPC .......... *H01L 23/60* (2013.01); *G11C 16/0408* (2013.01); *G11C 16/26* (2013.01); *G11C 16/32* (2013.01)

(58) Field of Classification Search
CPC .......... H01L 23/60; G11C 7/02; G11C 16/26; G11C 11/5642; G11C 16/32; G11C 7/227; G11C 7/222; G11C 7/1066; G11C 7/1072

See application file for complete search history.

(56) References Cited

U.S. PATENT DOCUMENTS

| | | | | |
|---|---|---|---|---|
| 5,963,502 A | * | 10/1999 | Watanabe ................ | G11C 7/22 327/141 |
| 9,172,299 B2 | | 10/2015 | Hamza et al. | |
| 2004/0021495 A1 | * | 2/2004 | Chen ....................... | H03K 5/133 327/291 |
| 2008/0232179 A1 | * | 9/2008 | Kwak ................... | H03K 3/0375 365/194 |
| 2009/0201057 A1 | * | 8/2009 | Pendurkar ................ | H03L 7/06 327/156 |
| 2016/0322964 A1 | * | 11/2016 | Miyano ................... | H03K 3/037 |
| 2020/0313678 A1 | * | 10/2020 | Takai ...................... | H03L 7/087 |

FOREIGN PATENT DOCUMENTS

| | | |
|---|---|---|
| CN | 101441857 | 5/2009 |
| JP | 5323170 | 10/2013 |
| TW | I345693 | 7/2011 |

* cited by examiner

*Primary Examiner* — Uyen Smet
(74) *Attorney, Agent, or Firm* — JCIPRNET

(57) ABSTRACT

A semiconductor device capable of suppressing generation of noise caused by EMI is provided. The flash memory includes a memory cell array, a clock generator (200), a readout part, an input/output circuit, an overlap detecting part (330) and a clock control part. The clock generator generates an internal clock signal. The readout part reads data from a selected memory cell of the memory cell array using the internal clock signal. The input/output circuit outputs the read data using an external clock signal supplied from outside. The overlap detecting unit detects a period during which a rising edge of the internal clock signal overlaps a rising edge of external clock signal. The clock control part controls a timing of the internal clock signal in response to the detected overlap period.

10 Claims, 8 Drawing Sheets

SEMICONDUCTOR DEVICE

CROSS-REFERENCE TO RELATED APPLICATION

This application claims the priority benefit of Japan application serial no. 2019-078396, filed on Apr. 17, 2019. The entirety of the above-mentioned patent application is hereby incorporated by reference herein and made a part of this specification.

BACKGROUND

Technical Field

The disclosure relates to a semiconductor device such as a NAND-type or NOR-type flash memory, and particularly relates to suppression of noise due to electro-magnetic interference (EMI).

Description of Related Art

A NAND-type flash memory is equipped with a continuous read function (burst read function) with which a plurality of pages are read in response to an external command. A page buffer/readout circuit, for example, includes two data registers, and when performing the continuous read operation, can output the data held by the other data register at the time of holding data read from an array in one of the data registers (for example, Patent Document 1: Japanese Patent No. 5323170).

FIG. 1 represents a schematic configuration of a NAND-type flash memory equipped with a chip-level error checking and correction (ECC) function. The flash memory includes: a memory cell array (memory cell array) 10 including a NAND string, a page buffer/readout circuit 20, a data transmission circuit 30, a data transmission circuit 32, an ECC circuit 40, and an input/output circuit 50. The page buffer/readout circuit 20 includes two latches L1 and L2 (4 KB per latch, for example) that hold read data or input data that should be programmed, where each of the latch L1 and the latch L2 includes a first cache C0 and a second cache C1 (2 KB per cache, for example).

FIG. 2 represents a timing diagram when a plurality of pages are continuously read. First, an array of a page 0 is read, and data of the page 0 is held in the first cache C0 and the second cache C1 (P0C0, P0C1) of the latch L1. In the continuous reading, a row address counter automatically increments, and a next page 1 is read. Data of the first cache C0 of the latch L1 is transmitted to the first cache C0 of the latch L2, and further, the data of the first cache C0 is transmitted to the ECC circuit 40 at the same time. The ECC circuit 40 performs calculation of ECC decoding, and when detecting an error, the ECC circuit 40 corrects data of the first cache C0 of the latch L2.

Subsequently, the data of the first cache C0 of the latch L2 is transmitted to the input/output circuit 50, and data held by the input/output circuit 50 is output synchronously with an external clock signal ExCLK supplied from the outside. In this period, data of the second cache C1 of the latch L1 is transmitted to the latch L2, and the data transmitted to the second cache C1 of the latch L2 is transmitted to the ECC circuit 40. Here, the calculation of ECC decoding is performed, and when an error is detected, and the data of the second cache C1 is corrected. Further, in this period, when the data of the second cache C1 of the latch L1 is transmitted to the latch L2, the page 1 of the memory array is read, and the data of the page 1 is transmitted to the latch L1 (P1C0, P1C1).

Subsequently, the data of the second cache C1 of the latch L2 is transmitted to the input/output circuit 50, and the data held by the input/output circuit 50 is output synchronously with the external clock signal ExCLK. In this period, the data of the first cache C0 of the latch L1 is transmitted to the latch L2, and the data transmitted to the first cache C0 of the latch L2 is transmitted to the ECC circuit 40. Here, the calculation of ECC decoding is performed, and when an error is detected, and the data of the first cache C0 is corrected.

In this way, the two stages of the latches L1 and L2 are used, the ECC processing is performed on the second cache C1 during outputting of the data of the first cache C0, and the ECC processing is performed on the first cache C0 during outputting of the data of the second cache C1. Accordingly, continuous reading of pages is accelerated.

While continuous reading of pages is accelerated, the flash memory may generate noise caused by electro-magnetic interference (EMI) between the external clock signal ExCLK and an internal clock signal InCLK generated by an internal clock generator. The internal clock signal InCLK have a different frequency from and not synchronous with the external clock signal ExCLK, and if the two clock signals overlap during a timing or a period of a specific operation, a large peak current flows, and consequently, noise that cannot be ignored may be generated.

For example, the external clock signal ExCLK at approximately 200 MHz is supplied to the input/output circuit 50, and the input/output circuit 50 outputs data synchronously with the external clock signal ExCLK. The input/output circuit 50, for example, includes a parallel/serial conversion circuit connected to m flip-flops, inputs m-bit data in a parallel manner in response to a rising edge of the external clock signal ExCLK, converts the data into serial data, and outputs the serial data to the outside.

During continuous reading, in the operation of the input/output circuit 50, the data of the latch L1 and data of the latch L2 are accessed. That is, internal operations, such as reading of the pages of the memory cell array, transmitting of the read data, and driving of a charge pump circuit configured to generate a pass voltage or a pre-charge voltage, are performed simultaneously. A state machine, a micro-controller, a charge pump circuit, or the like controls or performs the internal operation in response to, for example, a rising edge of the internal clock signal InCLK at 40 MHz generated by a built-in clock generator.

When the rising edge of the external clock signal ExCLK overlaps or is close to the rising edge of the internal clock signal InCLK in terms of time, since a large peak current is generated by an operation synchronous with the clock, noise caused by EMI is generated. A case in which the noise caused by EMI is highest is the case when the data held by the input/output circuit 50 is continuously output in response to the external clock signal ExCLK. When reading of a selection page or transmitting of read data is performed in response to the internal clock signal InCLK, when an unselected word line is boosted to a pass voltage, when a pre-charge voltage is applied to a bit line, or the like, the noise caused by EMI may make continuous read operations unstable, which leads to generation of a misoperation, and consequently results in degradation of performance and reliability.

SUMMARY

In view of the above, the disclosure provides a semiconductor device capable of suppressing generation of noise caused by EMI.

A semiconductor device of the disclosure includes: a memory cell array, including a plurality of memory cells; a generation part, configured to generate an internal clock signal; a readout part, configured to read data from a selected memory cell of the memory cell array by using the internal clock signal; an output part, capable of outputting, by using an external clock signal supplied from the outside, the data read by the readout part; a detection part, configured to detect a period during which the internal clock signal overlaps the external clock signal; and a clock control part, configured to control, in response to the overlap period detected by the detection part, at timing at which the generation part generates the internal clock signal.

According to an embodiment of the disclosure of the disclosure, the clock control part shifts, in response to the overlap period, a frequency of the internal clock signal. According to an embodiment of the disclosure of the disclosure, the clock control part shifts, in response to the overlap period, a phase of the internal clock signal. According to an embodiment of the disclosure of the disclosure, the detection part includes: a first detection circuit, configured to detect a rising edge of the internal clock signal; a second detection circuit, configured to detect a rising edge of the external clock signal; and a third detection circuit, configured to detect, based on a detection result of the first detection circuit and a detection result of the second detection circuit, a period during which the rising edge of the internal clock signal overlaps the rising edge of the external clock signal. According to an embodiment of the disclosure of the disclosure, the clock control part is enabled in an operation of continuously reading data from a plurality of selection pages. According to an embodiment of the disclosure of the disclosure, the clock control part is enabled when a predetermined specific operation is performed during a period in which the output parts outputs data. According to an embodiment of the disclosure of the disclosure, the clock control part reduces an operating voltage supplied to the generation part during the overlap period that is detected. According to an embodiment of the disclosure of the disclosure, the clock control part suppresses a rising edge of the internal clock signal during the overlap period that is detected. According to an embodiment of the disclosure of the disclosure, the readout part includes: a first holding circuit, configured to receive the data read from a selection page of the memory cell array; and a second holding circuit, configured to receive data held in the first holding circuit, wherein during a period when the first holding circuit is arranged to hold data from a next selection page, the readout part transmits, to the output part, read data from a previous selection page that is held by the second holding circuit.

According to the disclosure, a timing of an internal clock signal is controlled in response to a period during which an external clock signal overlaps the internal clock signal, thereby preventing EMI noise accompanying the internal clock signal and EMI noise accompanying the external clock signal from being added up. As a result, degradation of performance and reliability of the semiconductor device can be prevented.

DESCRIPTION OF THE EMBODIMENTS

Embodiments

Figure 3:
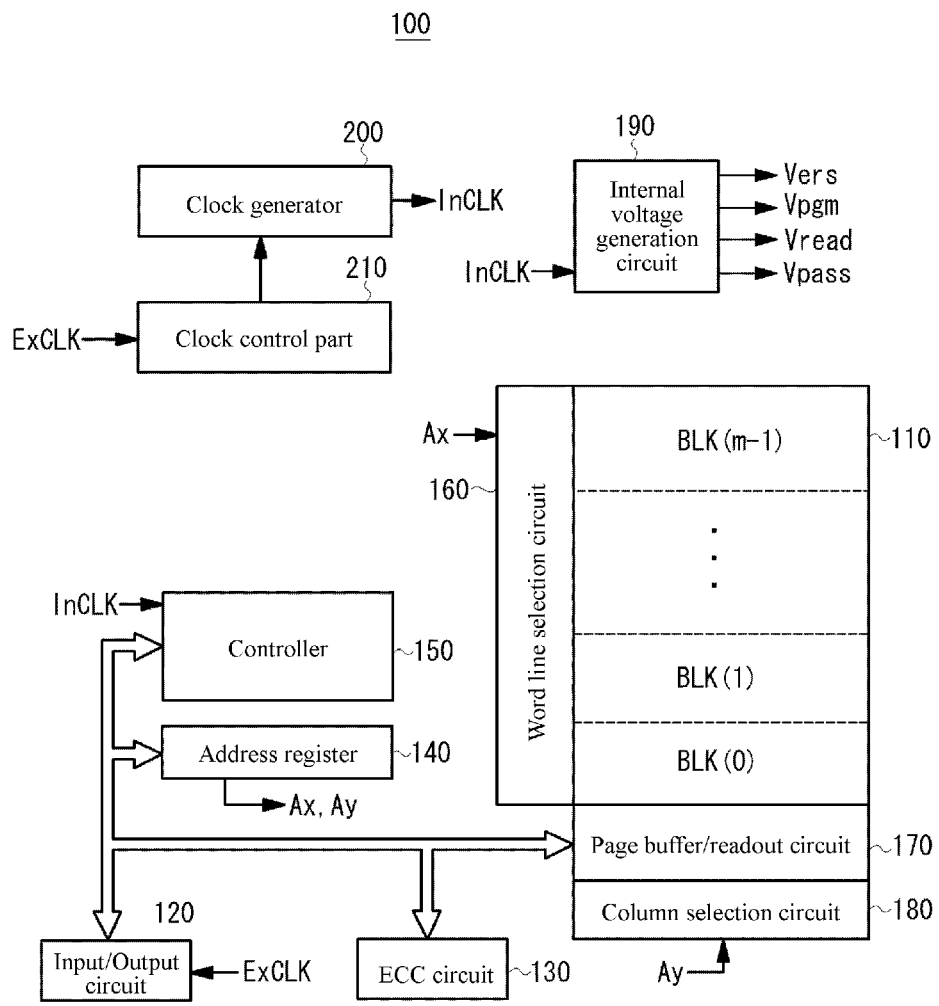
FIG. 3 is a block diagram representing a configuration of a NAND-type flash memory according to an embodiment of the disclosure.

FIG. 3 is a diagram representing a configuration of a NAND-type flash memory according to an embodiment of the disclosure. A flash memory 100 of this embodiment includes: a memory array 110, including a plurality of memory cells arranged as a matrix; an input/output circuit 120, connected to an external input/output terminal, and configured to respond to an external clock signal ExCLK, and output read data to the outside or access data input from the outside; an ECC circuit 130, configured to perform error checking/correction on data that should be programmed or the read data; an address register 140, configured to receive address data through the input/output circuit 120; a controller 150, configured to control all parts based on command data received through the input/output circuit 120 or a control signal applied to the terminal; a word line selection circuit 160, configured to receive row address information Ax from the address register 140, decode the row address information Ax, and perform block selection, word line selection, and the like based on a decoding result; a page buffer/readout circuit 170, configured to hold data read from a page selected by the word line selection circuit 160, or hold data to be programmed to the selected page; a column selection circuit 180, configured to receive column address information Ay from the address register 140, decode the column address information Ay, and perform column selection and the like in the page buffer/readout circuit 170 based on the decoding result; an internal voltage generation circuit 190, configured to generate various voltages (such as a write voltage Vpgm, a pass voltage Vpass, a read pass voltage Vread, and an erase voltage Vers) required for reading, programming, erasing, and the like of data; a clock generator 200, configured to generate an internal clock signal InCLK; and a clock control part 210, configured to control the clock generator 200.

The memory array 110 includes m storage blocks BLK(0), BLK(1), . . . , BLK(m−1) along a column direction. A plurality of NAND strings are formed in one storage block, and the NAND string is formed by connecting a plurality of memory cells in series. The NAND string may be formed two-dimensionally on a surface of a substrate, or may be formed three-dimensionally on a surface of a substrate. In addition, a memory cell may be a Single Level Cell (SLC) storing one bit (binary data) or a Multi Level Cell (MLC) storing a plurality of bits. A NAND string is formed by connecting a plurality of memory cells (for example, 64 memory cells), a bit line-side selection transistor, and a source line-side selection transistor in series. A drain of the bit line-side selection transistor is connected to a corresponding bit line BL, and a source of the source line-side selection transistor is connected to a shared source line SL.

Table 1 is a table presenting an example of a bias voltage applied by a flash memory during each operation. During a read operation, a specific positive voltage is applied to a bit line, a specific voltage (for example, 0 V) is applied to a selected word line, a pass voltage Vpass (for example, 4.5 V) is applied to an unselected word line, and a positive voltage (for example, 4.5 V) is applied to a selection gate line SGD and a selection gate line SGS, the bit line-side selection transistor and the source line-side selection transistor of the NAND string are switched on, and 0 V is applied to the shared source line. During programming (write) operation, a programming voltage Vpgm (15 V to 20 V) that is a high voltage is applied to a selected word line, an intermediate level (for example, 10 V) is applied to an unselected word line, so that the bit line-side selection transistor is switched, the source line-side selection transistor is switched off, and a level corresponding to data "0" or "1" is supplied to a bit line. During an erase operation, 0 V is applied to a selected word line in a block, a high voltage (for example, 20 V) is applied to a P well, and electrons of a floating gate are extracted to a substrate, to erase data by block.

TABLE 1

|  | Erase | Write | Read |
| --- | --- | --- | --- |
| Selected bit line | 0 | 15 to 20 V | 0 |
| Unselected bit line | F | 10 V | 4.5 |
| SGD | F | Vcc | 4.5 |
| SGS | F | 0 | 4.5 |
| SL | F | Vcc | 0 |
| P well | 21 | 0 | 0 |

Figure 1:
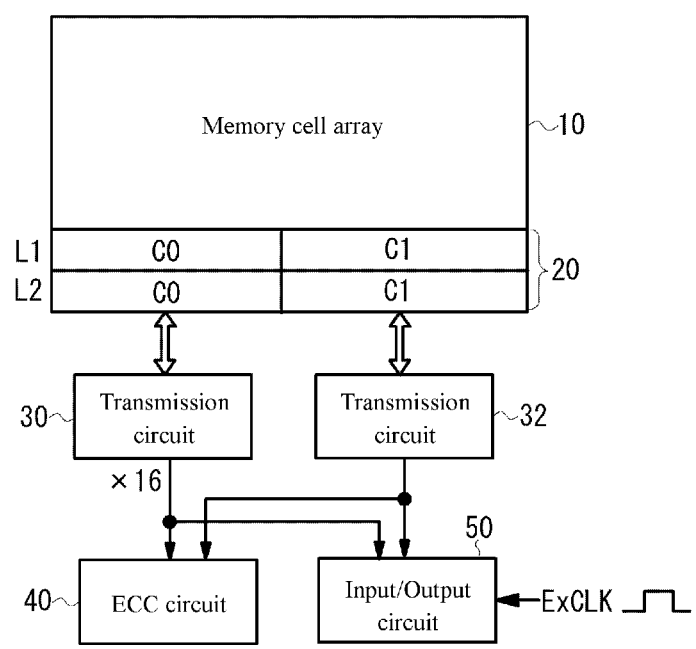
FIG. 1 is a diagram representing a schematic configuration of an existing NAND-type flash memory.
Figure 2:
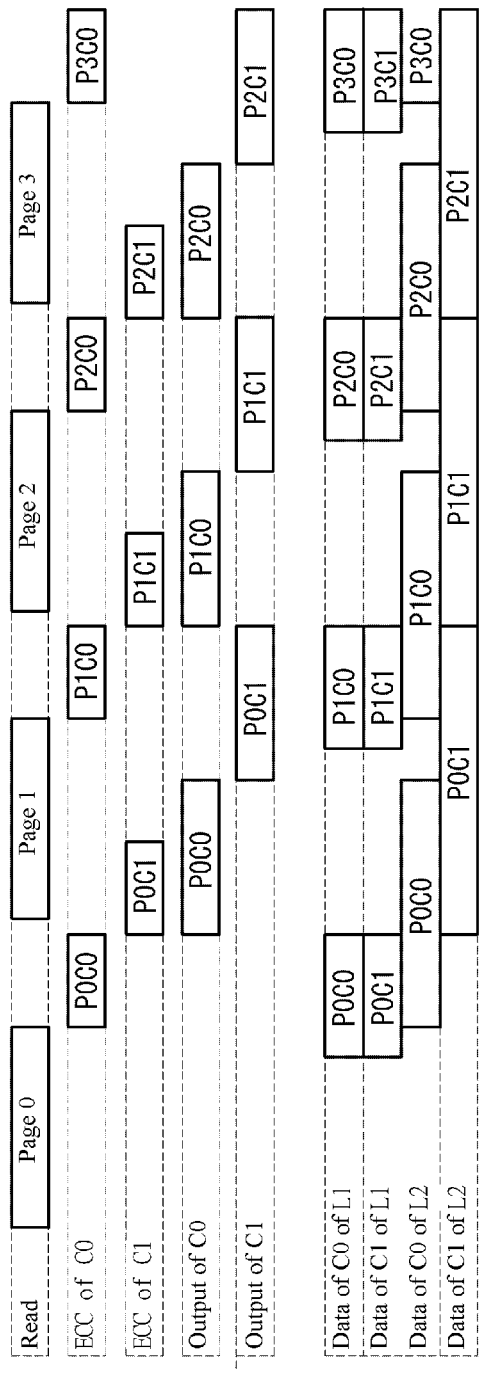
FIG. 2 is a timing diagram illustrating an operation of an existing NAND-type flash memory when performing continuous reading.

The page buffer/readout circuit 170, as shown in FIG. 1, includes a latch L1, a latch L2. The latch L1 and the latch L2 each include a first cache C0 and a second cache C1 that can operate independently. After receiving a continuous read operation command through the input/output circuit 120, the controller 150 controls a continuous read operation on a plurality of pages from a starting address to an end address. When the continuous read operation is performed, the following operation and the like are performed. That is, in a period during which one latch outputs data, data read from a memory cell array is received on the other latch by using two-level pipeline processing.

In addition, during the continuous read operation, the input/output circuit 120 outputs read data to the outside in response to an external clock signal ExCLK supplied from the outside. In this period, the controller 150 controls all the parts in response to the internal clock signal InCLK generated by the clock generator 200, and a charge pump circuit of the internal voltage generation circuit 190 generates a required voltage in response to the internal clock signal InCLK during a specific operation. During the continuous read operation, the clock control part 210 monitors the external clock signal ExCLK and the internal clock signal InCLK, and when the two is about to overlap, suppresses an overlap between the internal clock signal InCLK and the external clock signal ExCLK by controlling a generation timing of the internal clock signal InCLK.

Figure 4:
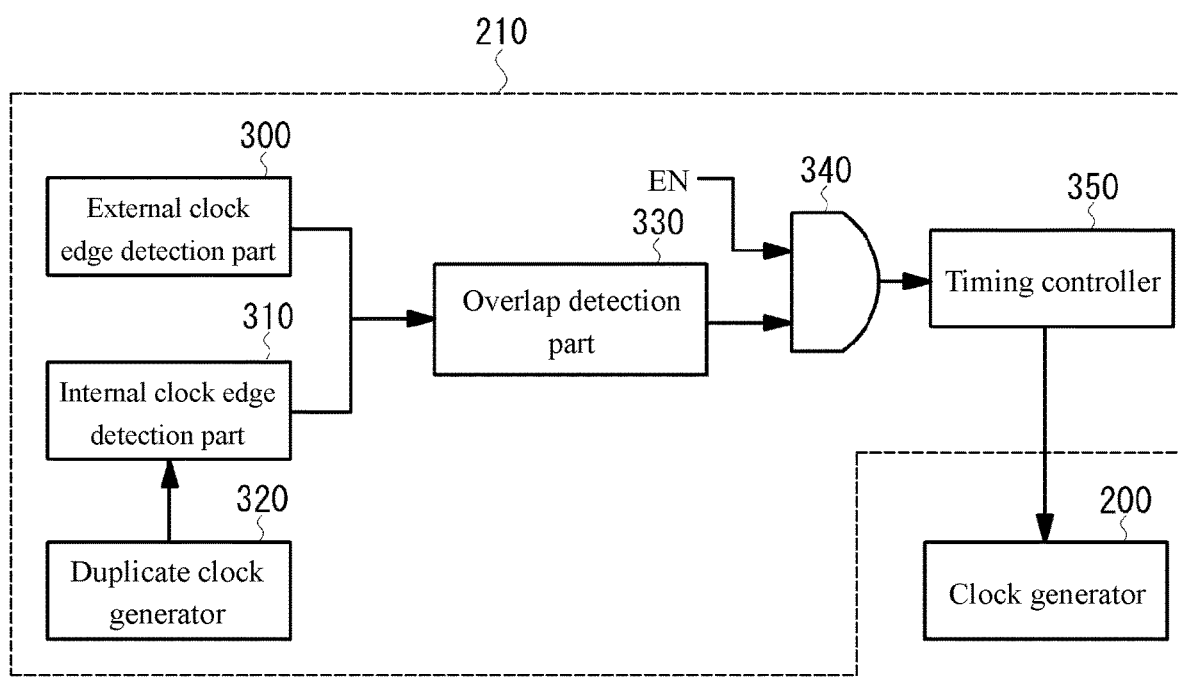
FIG. 4 is a block diagram representing a configuration of a clock control part according to an embodiment of the disclosure.

FIG. 4 represents details of the clock control part 210 of this embodiment. The clock control part 210 includes: an external clock edge detection part 300, configured to detect a rising edge of the external clock signal ExCLK; an internal clock edge detection part 310, configured to detect a rising edge of an internal clock signal InCLK generated by a duplicate clock generator 320; the duplicate clock generator 320, configured to duplicate the clock generator 200; an overlap detection part 330, configured to detect, based on a detection result of the external clock edge detection part 300 and a detection result of the internal clock edge detection part 310, a period during which the rising edge of the external clock signal ExCLK overlaps the rising edge of the internal clock signal InCLK; an AND circuit 340, configured to output logical AND of a detection result of the overlap detection part 330 and an enable signal EN; and a timing control part 350, configured to control, based on the output of the AND circuit 340, the timing at which the clock generator 200 generates the internal clock signal InCLK.

Figure 5A:
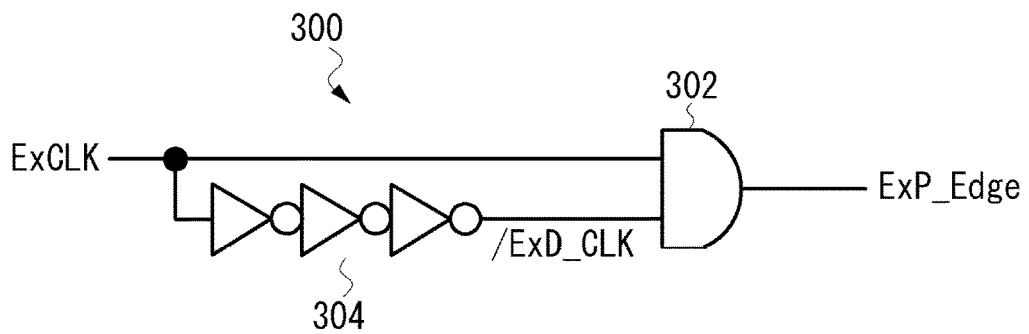
FIG. 5A represents a configuration of an external clock edge detection part according to an embodiment of the disclosure.
Figure 7:
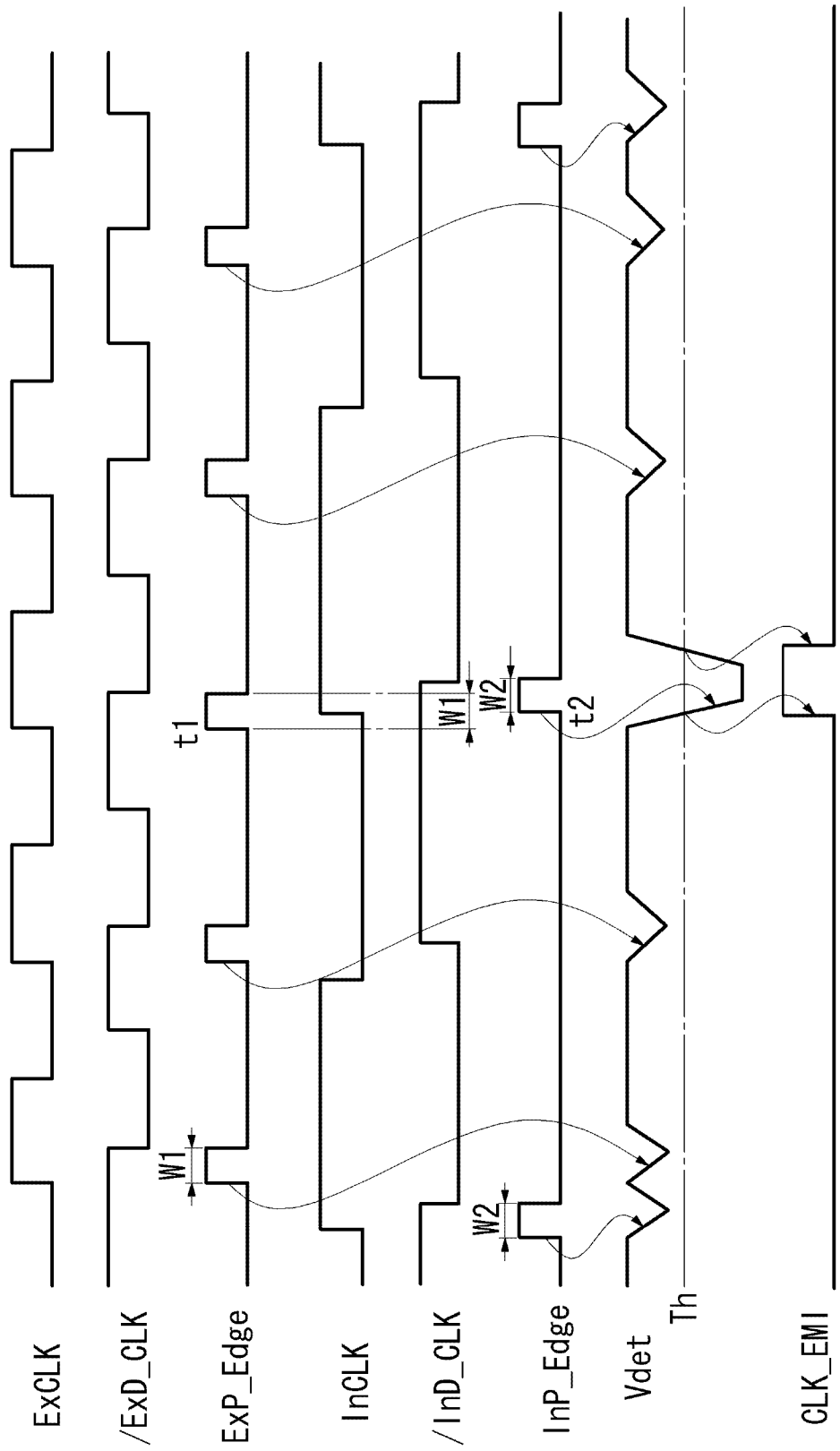
FIG. 7 is a timing diagram for illustrating an operation of a clock control part according to an embodiment of the disclosure.

The external clock edge detection part 300, for example, as shown in FIG. 5A, includes an AND circuit 302 and a plurality of inverters 304. The external clock signal ExCLK is supplied to an input end of the AND circuit 302, and an external clock signal/ExD_CLK obtained by delaying and inverting the external clock signal ExCLK by the plurality of inverters 304 is supplied to another input end. The AND circuit 302 outputs a detected signal ExP_CLK representing the rising edge of the external clock signal ExCLK. FIG. 7 illustrates an operation of the external clock edge detection part 300. As shown in FIG. 7, a delay time generated by the plurality of inverters 304 specifies a pulse width W1 of the detected signal ExP_CLK representing the rising edge of the external clock signal ExCLK. A time period W1 including the rising edge of the external clock signal ExCLK is set by using the delay time of the inverters 304, a specific margin is provided to a subsequent period during which the rising edge of the external clock signal ExCLK overlaps the rising edge of the internal clock signal InCLK, and a timing of the overlap is predicted.

Figure 5B:
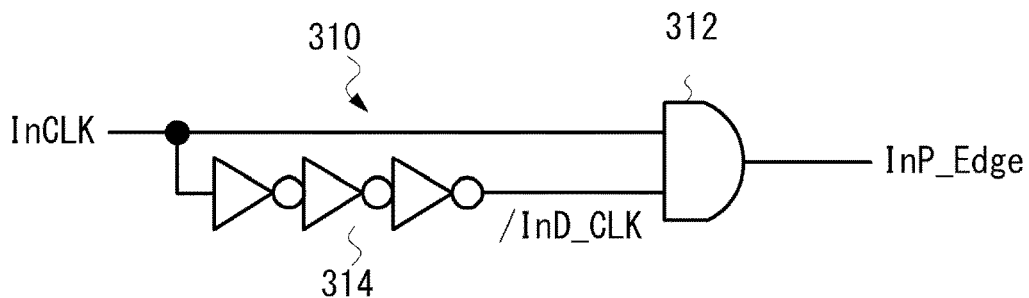
FIG. 5B represents a configuration of an internal clock edge detection part according to an embodiment of the disclosure.

The internal clock edge detection part 310 is also constituted in a same manner as stated above, and as shown in FIG. 5B, includes an AND circuit 312 and a plurality of inverters 314. The internal clock signal InCLK generated by the duplicate clock generator 320 is supplied to an input end of the AND circuit 312, and an internal clock signal/InD_CLK obtained by delaying and inverting the internal clock signal InCLK by the plurality of inverters 314 is supplied to another input end. The AND circuit 312 outputs a detected signal InP_CLK presenting the rising edge of the internal clock signal InCLK. FIG. 7 illustrates an operation of the internal clock edge detection part 310. As shown in FIG. 7, a delay time generated by the plurality of inverters 314 specifies a pulse width W2 of the detected signal InP_CLK representing the rising edge of the internal clock signal InCLK. By appropriately setting the pulse width W2, the timing of the overlap between the external clock signal ExCLK and the rising edge of the internal clock signal InCLK has a margin, and the timing of the overlap is predicted.

Figure 6:
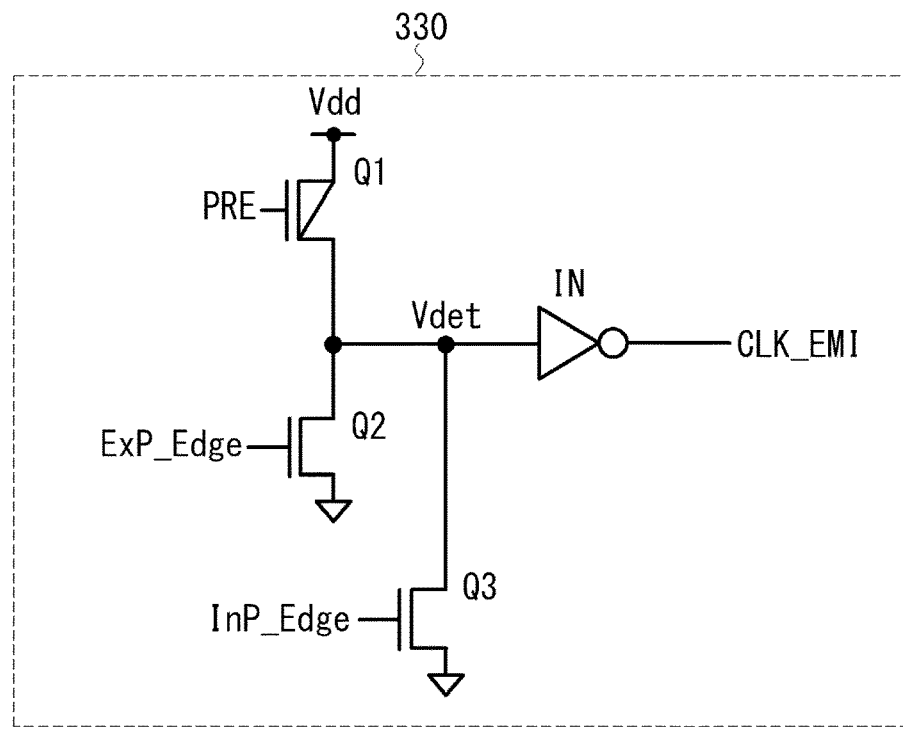
FIG. 6 is a diagram representing a configuration of an overlap detection part according to an embodiment of the disclosure.

FIG. 6 represents a configuration of the overlap detection part 330. The overlap detection part 330 includes: a P-channel Metal Oxide Semiconductor, PMOS transistor Q1, connected between a supply voltage Vdd and a detection node Vdet; an N-channel Metal Oxide Semiconductor (NMOS) transistor Q2 and an NMOS transistor Q3, connected to the detection node Vdet in parallel; and an inverter IN, configured to invert a logical potential of the detection node Vdet, and output a detected signal CLK_EMI representing an overlap period. For example, a pre-charge signal PRE is applied from the controller 150 to a gate of the transistor Q1. The pre-charge signal PRE is usually an L potential (GND), and therefore, the detection node Vdet is always pre-charged to an H potential. A detected signal ExP_Edge representing the rising edge of the external clock signal ExCLK is input to a gate of the transistor Q2, and a detected signal InP_Edge representing the rising edge of the internal clock signal InCLK is input to a gate of the transistor Q3.

FIG. 7 illustrates an operating waveform of the overlap detection part 330. When detecting a rising edge of either the external clock signal ExCLK or the internal clock signal InCLK, the detected signal ExP_Edge or the detected signal InP_Edge becomes an H potential only in a period of the pulse width W1/W2. Therefore, if either of the transistor Q2 or the transistor Q3 is switched on, a level of the detection node Vdet decreases. At this time, the level of the detection node Vdet specifies a maximum of the pulse width W1/W2 in a manner of being not lower than a threshold Th of the inverter IN, that is, a maximum of the delay time of the inverters 304/314.

For example, when rising of the external clock signal ExCLK is detected at a moment t1, and rising of the internal clock signal InCLK is detected at a moment t2 in the period of the pulse width W1, the two transistors Q2 and the transistor Q3 are simultaneously switched on, and the level of the detection node Vdet is lower than the threshold Th of the inverter IN. In this way, output of the inverter IN is inverted, and in a specific period, the detected signal CLK_EMI at the H potential representing the overlap period is output.

An enable signal EN input to an input end of the AND circuit 340 is, for example, supplied by the controller 150, and when the enable signal EN is at the H potential, the AND circuit 340 outputs the detected signal CLK_EMI at the H potential that is detected by the overlap detection part 330 and that represents the overlap period to the timing control part 350.

By determining the enable signal EN to be at the H potential, the controller 150 enables the clock control part 210 to enter an operable state. For example, during a continuous read operation, the controller 150 determines the enable signal EN to be at the H potential. A start and an end of the continuous read operation, for example, are determined in response to a command from a host device. In addition, for another example, the controller 150 may alternatively determine the enable signal EN to be at the H potential in response to a predetermined operation in a continuous read operation. The so-called predetermined operation, for example, a predicted operation maximizing noise caused by EMI. For example, in a period during which the input/output circuit 120 outputs read data, when any operation in a period during which the bit line is pre-charged during reading of the memory cell array, a period during which a pass voltage is applied, and a period during which the charge pump circuit is enabled to operate is performed, the enable signal EN is determined to be at the H potential.

When receiving from the AND circuit 340 the detected signal CLK_EMI representing the overlap period, in response to the detected signal CLK_EMI, the timing control part 350 controls the timing at which the clock generator 200 generates the internal clock signal InCLK.

Figure 8:
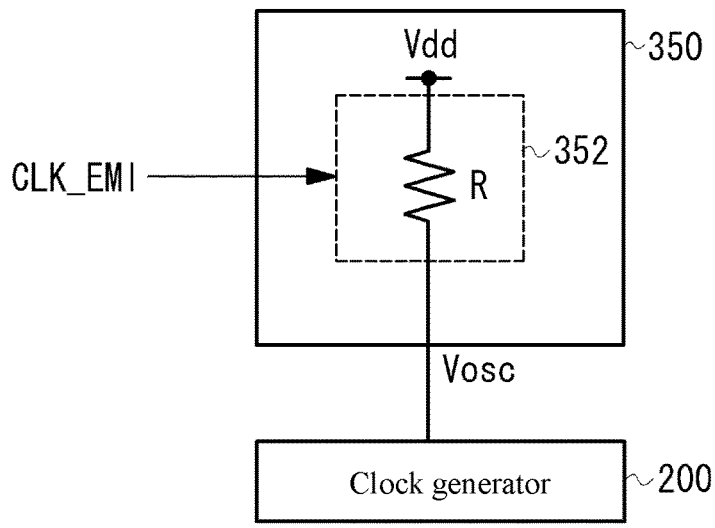
FIG. 8 is a diagram illustrating a first timing control method of a clock control part according to an embodiment of the disclosure.

In a first timing control method, a frequency of the internal clock signal InCLK is deviated, and generation of an overlap between the rising edge of the internal clock signal InCLK and the rising edge of the external clock signal ExCLK is suppressed. The timing control part 350, for example, as shown in FIG. 8, includes an operating voltage regulation part 352, configured to regulate an operating voltage Vosc used to enable the clock generator 200 to operate. In response to the detected signal CLK_EMI at the H potential output by the AND circuit 340, the operating voltage regulation part 352 changes a resistance R to a predetermined high resistance R1, reduces an operating voltage Vosc, and deviates, an operating speed of the clock generator 200, that is, the frequency of the internal clock signal InCLK to a low frequency. When the detected signal CLK_EMI output by the AND circuit 340 migrates to the L potential, the operating voltage regulation part 352 recovers the resistance R to an original state, recovers the operating voltage Vosc to an original voltage potential, and recovers the internal clock signal InCLK to an original frequency. In this way, generation of an overlap between the internal clock signal InCLK and the external clock signal ExCLK can be suppressed by deviating the internal clock signal InCLK to a lower frequency.

Subsequently, a second timing control method is described. In the second timing control method, in the detected overlap period, that is, in response to the detected signal CLK_EMI, the rising edge of the internal clock signal InCLK is deviated.

Figure 9A:
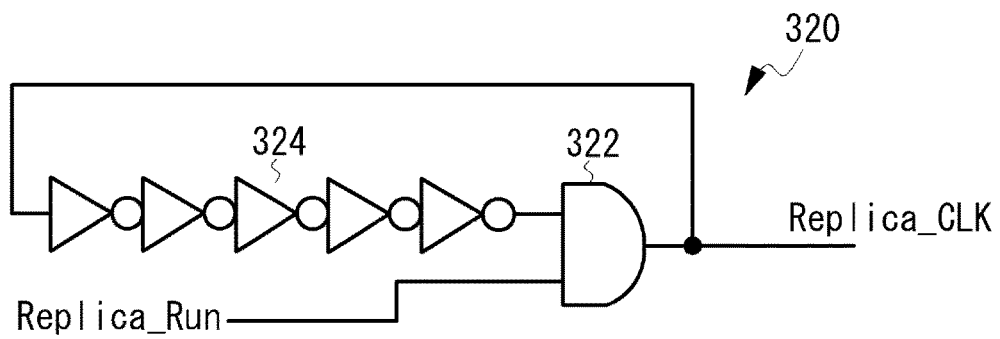
FIG. 9A and FIG. 9B are diagrams illustrating a second timing control method of a clock control part according to an embodiment of the disclosure.

When the enable signal EN from the controller 150 is determined to be at the H potential, as shown in FIG. 9A, the frequency control part 210 can provide to an AND circuit 322 a signal Replica_Run used for enabling the duplicate clock generator 320 to operate. The duplicate clock generator 320, as shown FIG. 9A, includes the AND circuit 322 and a plurality of inverters 324. A signal Replica_Run is provided to an input end of the AND circuit 322, and output of the AND circuit 322 is connected to another input end through feedback of the inverter 324.

Figure 9B:
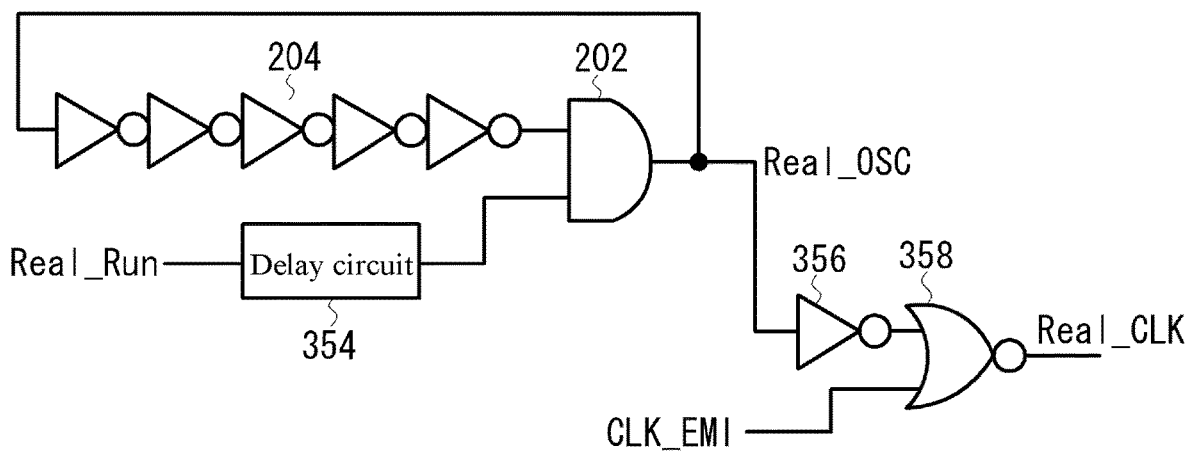

In addition, as shown in FIG. 9B, the timing control part 350 includes a delay circuit 354 connected to the clock generator 200, an inverter 356, and an NOR circuit 358. The same as the duplicate clock generator 320, the clock generator 200 includes the AND circuit 202 and the plurality of inverters 204. A signal Replica_Run delayed by the delay circuit 354 is provided to an input end of the AND circuit 202, and output of the AND circuit 202 is connected to another input end through feedback of the inverter 204. For an input end of the NOR circuit 358, an internal clock signal Real_OSC generated by the clock generator 200 is provided through by the inverter 356, and for another input end, the detected signal CLK_EMI representing the overlap period is provided, and the NOR circuit 358 outputs an internal clock signal Real_CLK.

Figure 10:
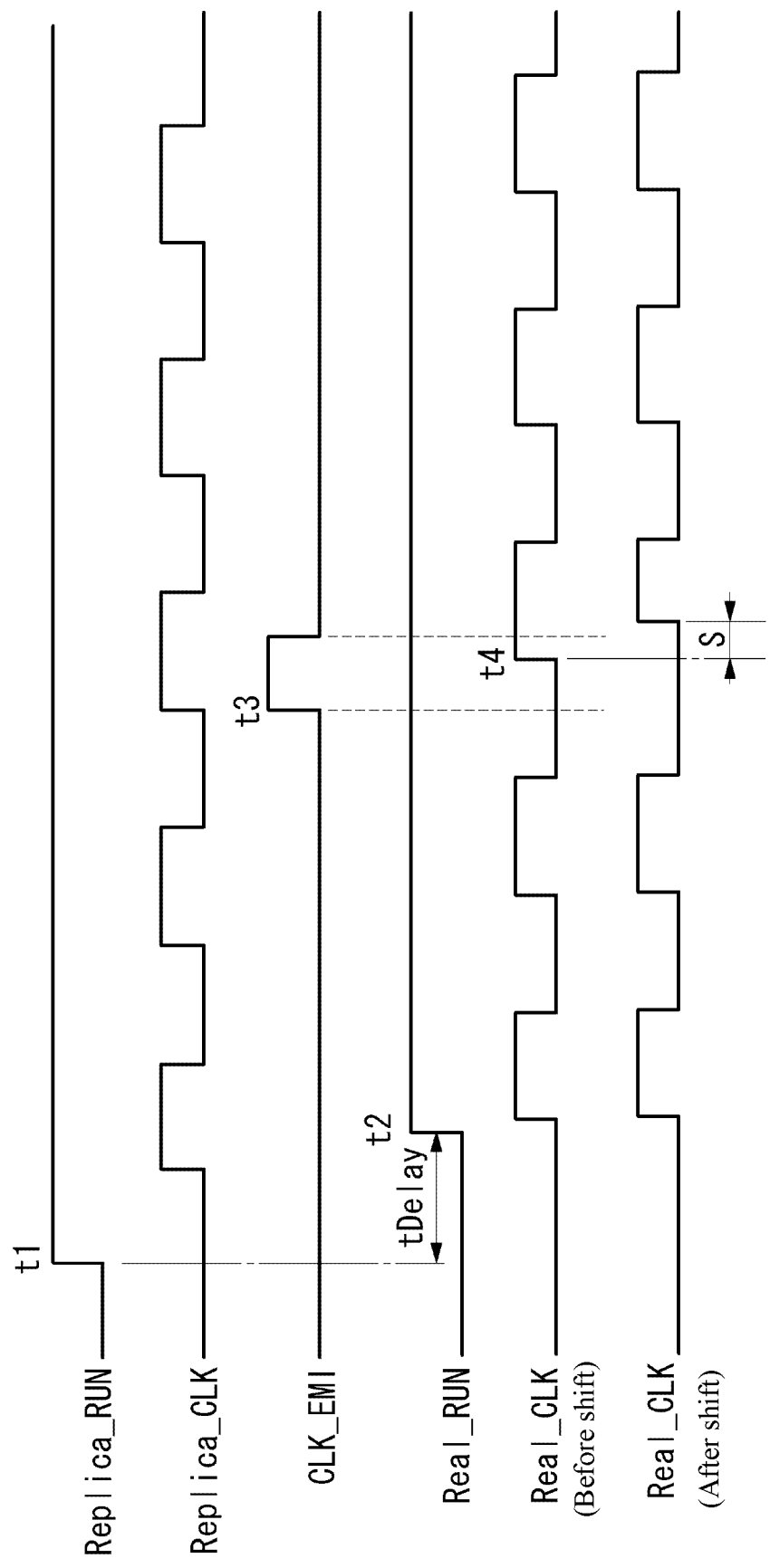
FIG. 10 is a timing diagram for illustrating an operation of a clock control part according to another embodiment of the disclosure.

FIG. 10 illustrates operating waveforms of the duplicate clock generator 320 and the clock generator 200 shown in FIG. 9A and FIG. 9B. First, at a moment t1, when signal Replica_Run is at the H potential, the duplicate clock generator 320 outputs a duplicate internal clock signal Replica_CLK from the AND circuit 322. On the other hand, when at a moment t2 after a specific time delay tDelay from the moment t1, a signal Real_Run is at the H potential, the clock generator 200 outputs a clock signal Real_OSC from the AND circuit 202. Therefore, a phase of the clock signal Real_OSC deviates from the duplicate internal clock signal Replica_CLK by the delay time tDelay.

In a period during which the duplicate internal clock signal Replica_CLK does not overlap with the rising edge of the external clock signal ExCLK, the detected signal CLK_EMI is at the L potential, and the internal clock signal Real_CLK output from the NOR circuit 358 and the clock signal Real_OSC have a same phase, that is, the phase does not deviate.

For example, at a moment t3, when the duplicate internal clock signal Replica_CLK overlaps the rising edge of the external clock signal ExCLK, the overlap detection part 330 detects the overlap, and the detected signal CLK_EMI that represents the overlap and that migrates to the H potential is input to the NOR circuit 358. In a period during which the detected signal CLK_EMI is at the H potential, because output of the NOR circuit 358 is fixed at the L potential, in this period, rising of the internal clock signal Real_CLK is suppressed. For example, at a moment t4, if no overlap is detected, the internal clock signal Real_CLK rises at the moment t4. However, if an overlap is detected, rising of the internal clock signal Real_CLK deviates from a moment t5 at which the detected signal CLK_EMI is at the L potential by an offset S.

In this way, according to this embodiment, in a period during which the overlap detection part 330 detects an overlap, the internal clock signal Real_OSC is deviated by using the signal Replica_Run, or rising of the internal clock signal is deviated by using the NOR circuit 358, so that noise caused by EMI can be reduced. In addition, in the first timing control method, an example of reducing a frequency of an internal clock signal in an overlap period, but this is not limited thereto. Alternatively, the frequency of the internal clock signal may be raised on the contrary. In this case, the resistance R may be regulated, to raise the operating voltage Vosc supplied to the clock generator 200. Therefore, in a continuous read operation, noise caused by EMI can be automatically reduced, to prevent degradation of performance or reliability.

It will be apparent to those skilled in the art that various modifications and variations can be made to the structure of the disclosure without departing from the scope or spirit of the disclosure. In view of the foregoing, it is intended that the present invention cover modifications and variations of this invention provided they fall within the scope of the following claims and their equivalents.

What is claimed is:

1. A semiconductor device, comprising:
   a memory cell array, comprising a plurality of memory cells;
   a generation part, configured to generate an internal clock signal;
   a readout part, configured to read data from a selected memory cell of the memory cell array by using the internal clock signal;
   an output part, capable of outputting, by using an external clock signal supplied from an outside, the data read by the readout part;
   a detection part, configured to detect a period during which the internal clock signal overlaps the external clock signal; and
   a clock control part, configured to control, in response to the overlap period detected by the detection part, a timing at which the generation part generates the internal clock signal to suppress an overlap between the internal clock signal and the external clock signal.

2. The semiconductor device according to claim 1, wherein the clock control part shifts, in response to the overlap period, a frequency of the internal clock signal.

3. The semiconductor device according to claim 1, wherein the clock control part shifts, in response to the overlap period, a phase of the internal clock signal.

4. The semiconductor device according to claim 1, wherein the detection part comprises: a first detection circuit, configured to detect a rising edge of the internal clock signal; a second detection circuit, configured to detect a rising edge of the external clock signal; and a third detection circuit, configured to detect, based on a detection result of the first detection circuit and a detection result of the second detection circuit, a period during which the rising edge of the internal clock signal overlaps the rising edge of the external clock signal.

5. The semiconductor device according to claim 1, wherein the clock control part is enabled in an operation of continuously reading data from a plurality of selection pages.

6. The semiconductor device according to claim 1, wherein the clock control part is enabled when a predetermined specific operation is performed during a period in which the output part outputs data.

7. The semiconductor device according to claim 2, wherein the clock control part reduces an operating voltage supplied to the generation part during the overlap period that is detected.

8. The semiconductor device according to claim 3, wherein the clock control part suppresses a rising edge of the internal clock signal during the overlap period that is detected.

9. The semiconductor device according to claim 1, wherein the readout part comprises: a first holding circuit, configured to receive data read from a selection page of the memory cell array; and a second holding circuit, configured to receive data held in the first holding circuit, wherein during a period when the first holding circuit is arranged to hold read data from a next selection page, the readout part transmits, to the output part, read data from a previous selection page that is held by the second holding circuit.

10. The semiconductor device according to claim 1, wherein the semiconductor device comprises a NAND-type flash memory.

* * * * *